United States Patent
Han et al.

(10) Patent No.: US 11,315,998 B2
(45) Date of Patent: Apr. 26, 2022

(54) DISPLAY APPARATUS

(71) Applicant: SAMSUNG DISPLAY CO., LTD., Yongin-si (KR)

(72) Inventors: Jaebum Han, Yongin-si (KR); Younggil Park, Yongin-si (KR); Junghwa Park, Yongin-si (KR); Nari Ahn, Yongin-si (KR); Sooim Jeong, Yongin-si (KR); Kinam Kim, Yongin-si (KR); Moonsung Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 24 days.

(21) Appl. No.: 16/883,399

(22) Filed: May 26, 2020

(65) Prior Publication Data
US 2020/0395425 A1   Dec. 17, 2020

(30) Foreign Application Priority Data

Jun. 12, 2019  (KR) .......................... 10-2019-0069553

(51) Int. Cl.
*H01L 27/14*    (2006.01)
*H01L 27/32*    (2006.01)
(Continued)

(52) U.S. Cl.
CPC ...... *H01L 27/3262* (2013.01); *H01L 27/3265* (2013.01); *H01L 27/3272* (2013.01);
(Continued)

(58) Field of Classification Search
CPC ............. H01L 27/3262; H01L 27/3265; H01L 27/3272
(Continued)

(56) References Cited

U.S. PATENT DOCUMENTS 8,815,663 B2    8/2014 Park et al.
9,985,082 B2    5/2018 Lee et al.
(Continued)

FOREIGN PATENT DOCUMENTS

KR    10-2018-0005581    1/2018
KR    10-2018-0097198    8/2018
(Continued)

*Primary Examiner* — Tan N Tran
(74) *Attorney, Agent, or Firm* — F. Chau & Associates, LLC

(57) ABSTRACT

A display apparatus that includes a substrate, a first thin-film transistor and a second, thin-film transistor disposed on the substrate at different distances from a top surface of the substrate. A display device is electrically connected to the first thin-film transistor. The first thin-film transistor includes a first semiconductor layer in polycrystalline silicon and a first gate electrode that overlaps a channel region of the first semiconductor layer in a direction of a thickness of the substrate. The second thin-film transistor includes a second semiconductor layer including an oxide semiconductor. The first gate electrode has a stacked structure including a first layer and a second layer. The second layer includes titanium and the first layer includes a different material from the second layer.

18 Claims, 8 Drawing Sheets

(51) Int. Cl.
  *H01L 27/12* (2006.01)
  *H01L 29/786* (2006.01)
  *H01L 29/49* (2006.01)

(52) U.S. Cl.
  CPC ...... *H01L 27/1225* (2013.01); *H01L 27/1251* (2013.01); *H01L 27/1255* (2013.01); *H01L 29/4908* (2013.01); *H01L 29/7869* (2013.01); *H01L 29/78618* (2013.01); *H01L 29/78633* (2013.01); *H01L 29/78675* (2013.01); *H01L 29/78696* (2013.01)

(58) Field of Classification Search
  USPC ...................................... 257/40, 59, 72, 432
  See application file for complete search history.

(56) References Cited

U.S. PATENT DOCUMENTS

| | | | |
|---|---|---|---|
| 10,797,088 B2 * | 10/2020 | Takechi | H01L 27/1225 |
| 2007/0085115 A1 * | 4/2007 | Chen | H01L 29/66833 |
| | | | 257/291 |
| 2018/0219029 A1 * | 8/2018 | Hanyu | H01L 29/4908 |
| 2018/0240910 A1 | 8/2018 | Khang et al. | |
| 2018/0366586 A1 | 12/2018 | Son et al. | |
| 2019/0081089 A1 | 3/2019 | Cho et al. | |
| 2020/0152663 A1 * | 5/2020 | Li | H01L 27/1251 |
| 2020/0176612 A1 * | 6/2020 | Wang | H01L 29/167 |
| 2020/0321475 A1 * | 10/2020 | Zhang | H01L 27/1288 |

FOREIGN PATENT DOCUMENTS

| | | |
|---|---|---|
| KR | 10-2018-0137640 | 12/2018 |
| KR | 10-2019-0013094 | 2/2019 |
| KR | 10-2019-0028587 | 3/2019 |

* cited by examiner

DISPLAY APPARATUS

This application claims priority under 35 U.S.C. § 119 to Korean Patent Application No. 102019-0069553, filed on Jun. 12, 2019 in the Korean Intellectual Property Office, the disclosure of which is incorporated by reference in its entirety herein.

CROSS-REFERENCE TO RELATED APPLICATION

1. Technical Field

One or more embodiments relate to a display apparatus.

2. Discussion of Related Art

Display devices for displaying various types of electrical signal information have undergone rapid development. For example, various flat panel display apparatuses have been developed which provide improved features, such as a slim profile, a low weight, and low power consumption. These flat-panel display apparatuses may include a thin-film transistor (TET), a capacitor, and the like. TFTs may have different characteristics according to the materials of the semiconductor layers included in the TFTs. Display apparatuses may employ different types of TFTs to provide an improved performance.

SUMMARY

For example, a display apparatus may employ a first thin-film transistor including a polycrystalline silicon semiconductor layer, and a second thin-film transistor including an oxide semiconductor layer. The first thin-film transistor may have improved characteristics by reducing a defect (trap) within the polycrystalline silicon semiconductor layer through thermal treatment. However, the thermal treatment performed to improve the characteristics of the first thin-film transistor may affect the oxide semiconductor layer, and accordingly the characteristics of the second thin-film transistor may be changed.

One or more exemplary embodiments include a display apparatus capable of improving the characteristics of a polycrystalline silicon semiconductor layer without affecting a silicon semiconductor layer.

Additional aspects will be set forth in part in the description which follows and, in part, will be apparent from the description, or may be learned by practice of the presented embodiments of the disclosure.

According to one or more exemplary embodiments, a display apparatus includes a substrate, a first thin-film transistor and a second thin-film transistor disposed on the substrate at different distances from a top surface of the substrate. A display device is electrically connected to the first thin-film transistor. The first thin-film transistor includes a first semiconductor layer including polycrystalline silicon and a first gate electrode that overlaps a channel region of the first semiconductor layer in a direction of a thickness of the substrate. The second thin-film transistor includes a second semiconductor layer including an oxide semiconductor. The first gate electrode has a stacked structure including a first layer and a second layer. The second layer includes titanium and the first layer includes a different material from the second layer.

The second layer may be disposed between the first layer and the first semiconductor layer.

The first gate electrode may further include a third layer that is disposed on the first layer and includes titanium.

The display apparatus may further include a capacitor that overlaps the first thin-film transistor in the direction of the thickness of the substrate, and the first gate electrode is a first electrode of the capacitor.

The capacitor may further include a second electrode that overlaps the tint electrode in the direction of the thickness of the substrate, the display apparatus may further include a first insulating layer disposed between the first semiconductor layer and the first gate electrode, a second insulating layer disposed between the first gate electrode and the second electrode, and a third insulating layer disposed on the second electrode. The second semiconductor layer may be disposed on the third insulating layer.

The display apparatus may further include a light barrier layer that overlaps the second semiconductor layer in the direction of the thickness of the substrate, and is disposed between the second insulating layer and the third insulating layer, and has conductivity.

The first semiconductor layer may include a channel region that overlaps the first gate electrode in the direction of the thickness of the substrate, and a drain region and a source region respectively arranged on both sides of the channel region. The channel region, the source region, and the drain region may be doped with identical impurities. A doping concentration of the impurities of the channel region may be less than each of respective doping concentrations of the impurities of the drain region and the source region.

The doping concentration of the impurities of the channel region may be $1 \times e^{11}/cm^2$ to $1 \times e^{13}/cm^2$.

The impurities may be boron (B).

A hydrogen concentration of the second semiconductor layer may be greater than a hydrogen concentration of the first semiconductor layer.

According to one or more exemplary embodiments, a display apparatus includes a substrate, a first thin-film transistor and a second thin-film transistor disposed on the substrate. A display device is electrically connected to the first thin-film transistor. The first thin-film transistor includes a first semiconductor layer including polycrystalline silicon and doped with impurities and a first gate electrode that overlaps the first semiconductor layer in a direction of a thickness of the substrate. The first semiconductor layer includes a channel region that overlaps the first gate electrode in the direction of the thickness of the substrate, and a drain region and a source region respectively arranged on both sides of the channel region. A doping concentration of the impurities of the channel region is less than doping concentrations of the impurities of the drain region and the source region. The first gate electrode includes a first layer and a second layer includes titanium and the first layer includes a different material from the second layer.

The doping concentration of the channel region may be $1 \times e^{11}/cm^2$ to $1 \times e^{13}/cm^2$.

The impurities may be boron (B).

The second layer may be disposed between the first layer and the first semiconductor layer.

The first gate electrode may further include a third layer that is disposed on the first layer and includes titanium.

The display apparatus may further include a capacitor that overlaps the first thin-film transistor in the direction of the thickness of the substrate, and the first gate electrode is a first electrode of the capacitor.

The capacitor may further include a second electrode that overlaps the first electrode in the direction of the thickness of the substrate. The display apparatus may further include a first insulating layer disposed between the first semiconductor layer and the first gate electrode, a second insulating layer disposed between the first gate electrode and the second electrode, and a third insulating layer disposed on the second electrode, and the second thin-film transistor layer may be disposed on the third insulating layer.

The second thin-film transistor may include a second semiconductor layer including an oxide semiconductor.

A hydrogen concentration of the second semiconductor layer may be greater than a hydrogen concentration of the first semiconductor layer.

The display apparatus may further include a light barrier layer that overlaps the second semiconductor layer in the direction of the thickness of the substrate and is disposed between the second insulating layer and the third insulating layer.

These and/or other aspects will become apparent and more readily appreciated from the following description of the embodiments, taken in conjunction with the accompanying drawings.

BRIEF DESCRIPTION OF THE DRAWINGS

The above and other aspects, features, and advantages of certain exemplary embodiments of the present inventive concepts will be more apparent from the following description taken in conjunction with the accompanying drawings, in which.

DETAILED DESCRIPTION OF THE EXEMPLARY EMBODIMENTS

Figure 1:
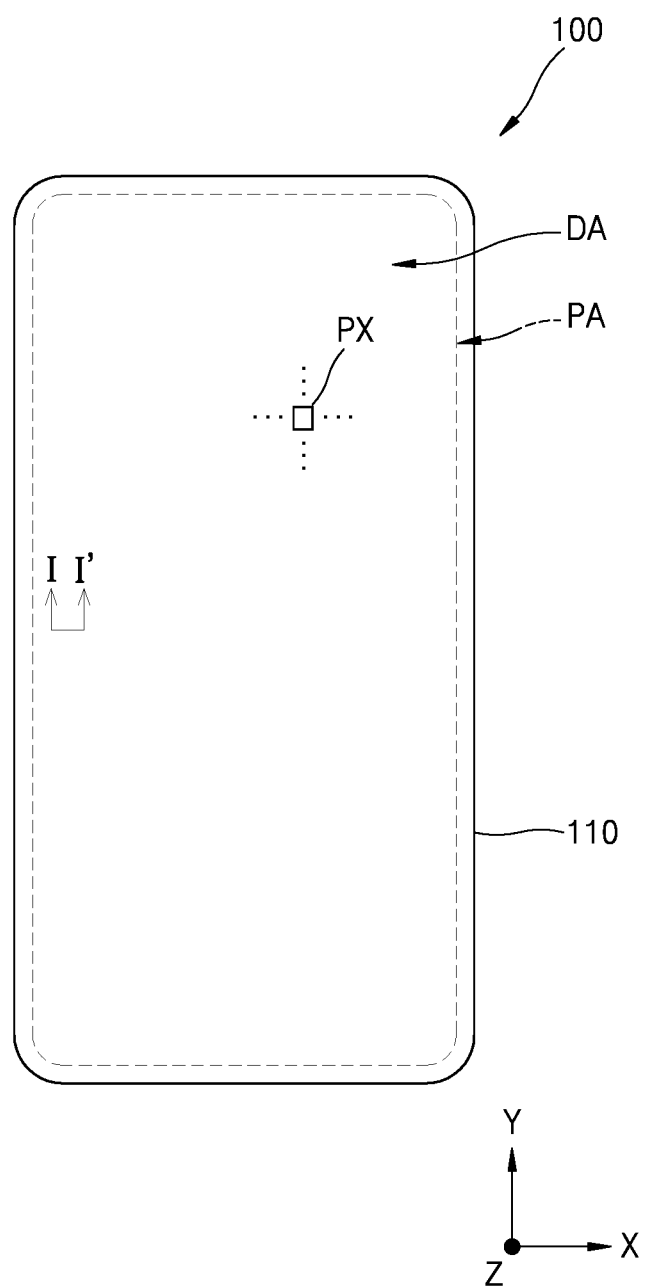
FIG. 1 is a top plan view of a display apparatus according to an exemplary embodiment of the present inventive concepts.

As the invention allows for various changes and numerous embodiments, particular exemplary embodiments will be illustrated in the drawings and described in detail in the written description. Hereinafter, effects and features of the present invention and a method for accomplishing them will be described more fully with reference to the accompanying drawings, in which exemplary embodiments of the present inventive concepts are shown. This invention may, however, be embodied in many different forms and should not be construed as limited to the exemplary embodiments set forth herein.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. For example, intervening layers, regions, or components may be present.

Sizes of elements in the drawings may be exaggerated for convenience of explanation. In other words, since sizes and thicknesses of components in the drawings are arbitrarily illustrated for convenience of explanation, the following exemplary embodiments are not limited thereto.

When a certain exemplary embodiment may be implemented differently, a specific process order may be performed differently from the described order. For example, two consecutively described processes may be performed substantially at the same time or performed in an order opposite to the described order.

One or more exemplary embodiments of the present inventive concepts will be described below in more detail with reference to the accompanying drawings. Those components that are the same or are in correspondence are rendered the same reference numeral regardless of the figure number.

Figure 2:
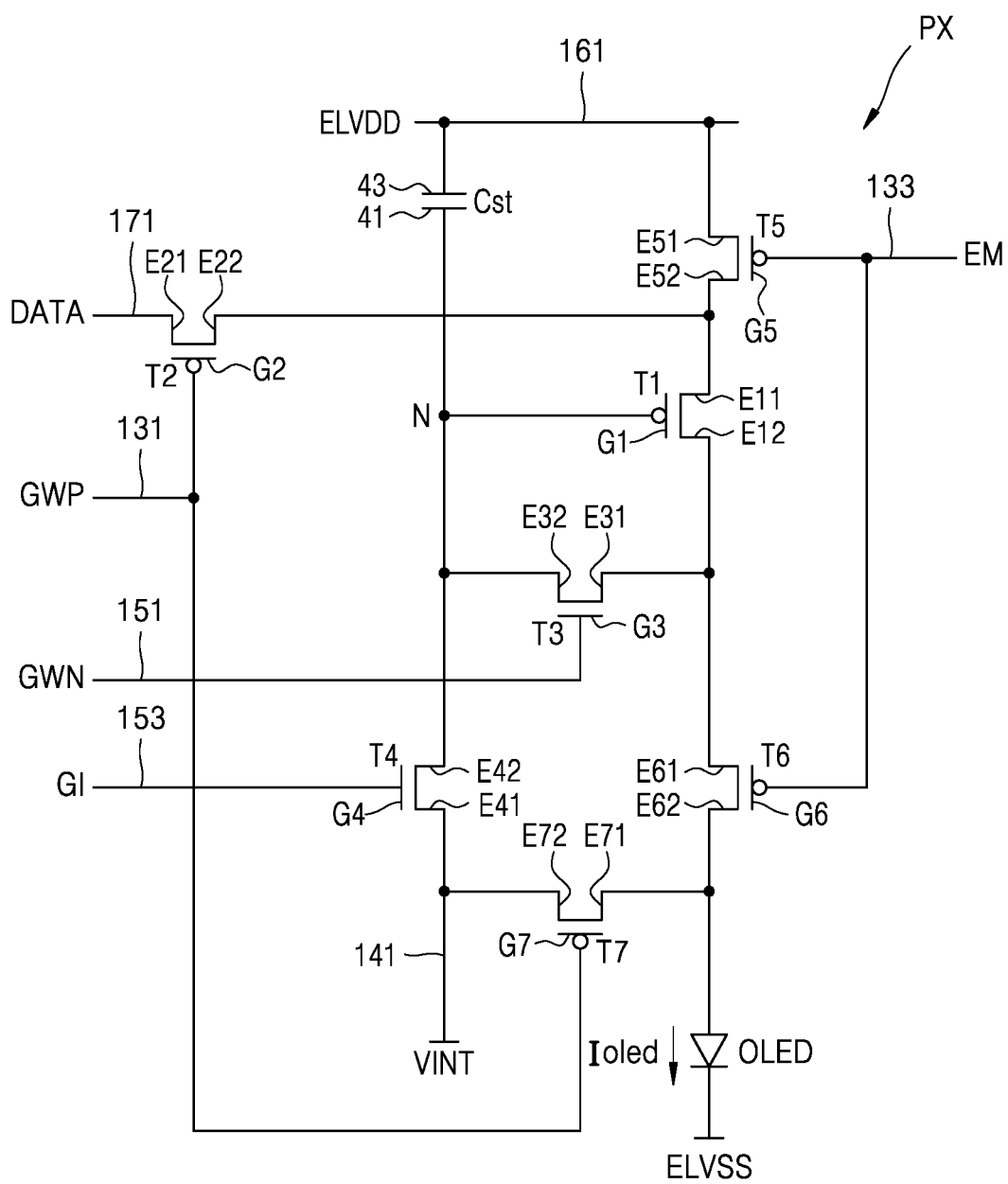
FIG. 2 is an equivalent circuit diagram of a (sub) pixel of a display apparatus according to an exemplary embodiment of the present inventive concepts.
Figure 3:
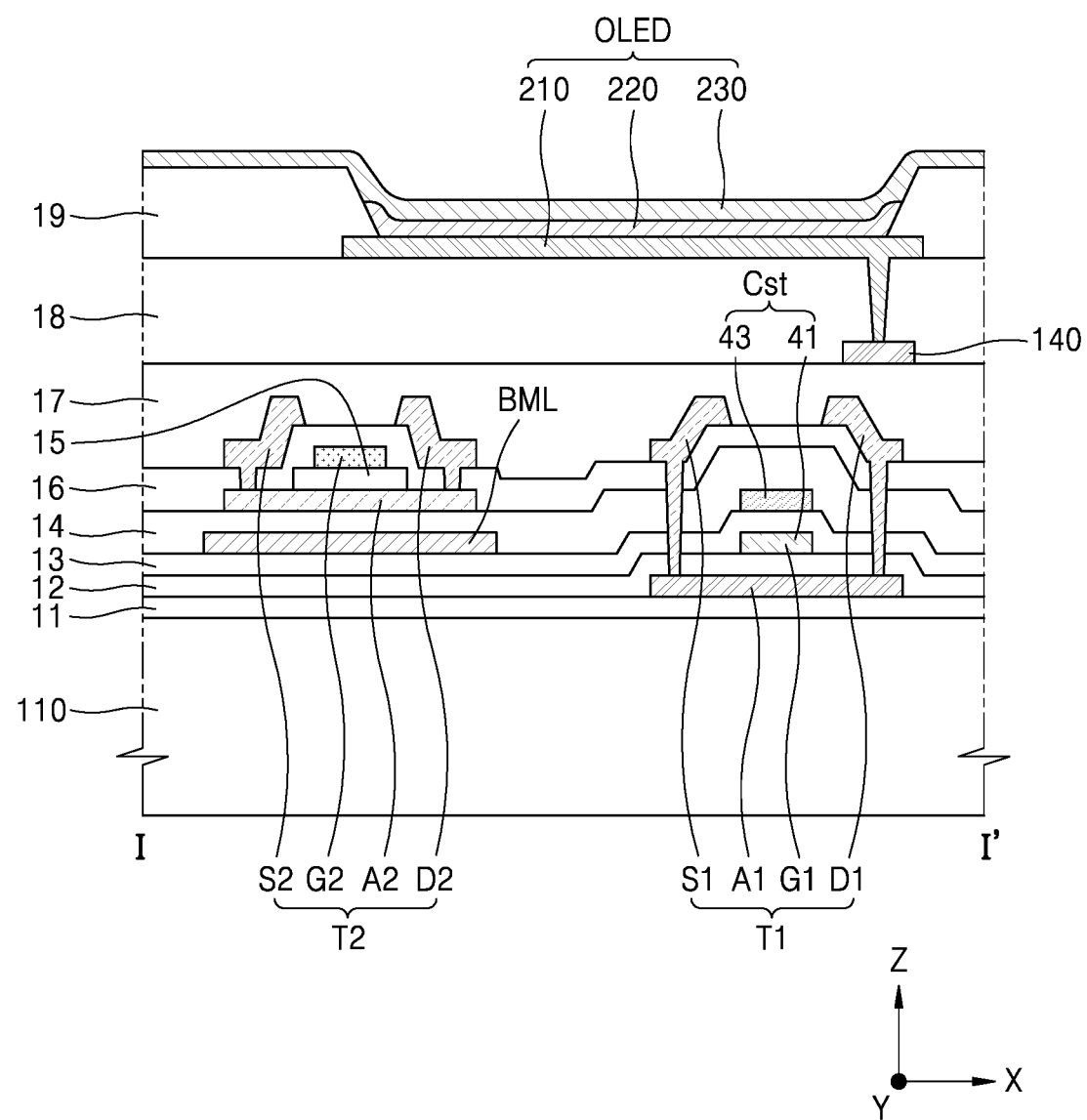
FIG. 3 is a cross-sectional view taken along line I-I' of FIG. 1, according to an exemplary embodiment of the present inventive concepts.

FIG. 1 is a top plan view of a display apparatus according to an exemplary embodiment of the present inventive concepts. FIG. 2 is an equivalent circuit diagram of one (sub) pixel of a display apparatus according to an exemplary embodiment of the present inventive concepts. FIG. 3 is a cross-sectional view taken along line I-I' of FIG. 1 according to an exemplary embodiment of the present inventive concepts.

Although an organic light-emitting display apparatus will now be illustrated and described, as a display apparatus 100 according to an exemplary embodiment of the present inventive concepts, exemplary embodiments are not limited thereto. For example, in other exemplary embodiments, the display apparatus 100 may be various different types of display apparatuses, such as an inorganic light-emitting display, a quantum dot light-emitting display, etc.

Referring to FIG. 1, the display apparatus 100 includes a substrate 110. The display apparatus 100 includes a display area DA where an image is displayed and a peripheral area PA located outside the display area DA. For example, in the exemplary embodiment shown in FIG. 1, the peripheral area PA is disposed alone the periphery of the display area DA in the X and/or Y directions. Accordingly, the substrate 110 has a display area DA and the peripheral area PA.

A plurality of pixels PX may be arranged on the display area DA. Each of the plurality of pixels PX may emit light, such as red light, green light, blue light, or white light, by including a display device such as an organic light-emitting diode (OLED).

FIG. 2 illustrates an exemplary embodiment of an equivalent circuit of each pixel PX. Referring to FIG. 2, each pixel PX may include a display device, and a pixel circuit that drives the display device. In an exemplary embodiment, the display device may be an OLED. However, exemplary embodiments are not limited thereto. For convenience of explanation, a pixel PX including an OLED as a display device will be illustrated and described herein.

Although each pixel PX includes signal lines, an initializing voltage line 141, and a power supply voltage line 161 in FIG. 2, exemplary embodiments are not limited thereto. According to another exemplary embodiment, at least one of the signal lines, the initializing voltage line 141, or/and the power supply voltage line 161 may be shared by neighboring pixels PX.

The signal lines include a first scan line 131 that transmits a first scan signal GWP, a second scan line 151 that transmits a second scan signal GWN, a third scan line 153 that transmits a third scan signal GI, a light-emission control line 131 that transmits a light-emission control signal EM, and a data line 171 that intersects with the first scan line 131 and transmits a data signal DATA.

The power supply voltage line 161 transmits a first power supply voltage ELVDD to a first thin-film transistor T1, and the initializing voltage line 141 transmits an initializing voltage VINT that initiates the first thin-film transistor T1 and a pixel electrode of an organic light-emitting diode OLED.

The pixel circuit of the pixel PX may include a plurality of thin-film transistors. For example, in the exemplary embodiment shown in FIG. 2, the pixel circuit includes first through seventh thin-film transistors T1 through T7, and a capacitor Cst. The first through seventh thin-film transistors T1 through T7 include first electrodes E11, E21, E31, E41, E51, E61, E71 and second electrodes E12, E22, E32, E42, E52, E62, E72 of FIG. 2. The first electrodes and second electrodes may each be a source electrode (source region) or a drain electrode (drain region) according to the type (p-type or n-type) and/or operating conditions of thin-film transistors. The capacitor Cst includes a first electrode 41 and a second electrode 43.

The first thin-film transistor T1 includes a gate electrode G1 connected to a first electrode 41 of the capacitor Cst, a first electrode E11 connected to the power supply voltage line 161 via the fifth thin-film transistor T5, and a second electrode E11 electrically connected to the pixel electrode of the organic light-emitting diode OLED via the sixth thin-film transistor T6. The first thin-film transistor T1 serves as a driving transistor, and receives the data signal DATA according to a switching operation of the second thin-film transistor T2 and supplies a current to the organic light-emitting diode OLED.

The second thin-film transistor T2 includes a gate electrode G2 connected to the first scan line 131, a first electrode E21 connected to the data line 171, and a second electrode E22 connected to the first electrode E11 of the first thin-film transistor T1. The second thin-film transistor T2 is turned on according to the first scan signal GWP received via the first scan line 131 and performs a switching operation of transmitting the data signal DATA received from the data line 171 to the first electrode E11 of the first thin-film transistor T1.

The third thin-film transistor T3 includes a gate electrode G3 connected to the second scan line 151, a first electrode E31 connected to the second electrode E12 of the first thin-film transistor T1, and a second electrode E32 connected to the first electrode 41 of the capacitor Cst, a second electrode E42 of the fourth thin-film transistor T4, and the gate electrode G1 of the first thin-film transistor T1. The first electrode E31 of the third thin-film transistor T3 is also connected to the pixel electrode of the organic light-emitting diode OLED via the sixth thin-film transistor T6. The third thin-film transistor T3 is turned on according to the second scan signal GWN received via the second scan line 151 and diode-connects the first thin-film transistor T1.

The fourth thin-film transistor T4 includes a gate electrode G4 connected to the third scan line 153, a first electrode E41 connected to the initializing voltage line 141, and a second electrode E42 connected to the first electrode 41 of the capacitor Cst, the second electrode E32 of the third thin-film transistor T3, and the gate electrode G1 of the first thin-film transistor T1. The fourth thin-film transistor T4 is turned on according to the third scan signal GI received via the third scan line 153 and transmits the initializing voltage VINT to the node N and to the gate electrode G1 of the first thin-film transistor T1 to thereby initialize a gate voltage of the first thin-film transistor.

The fifth thin-film transistor 15 includes a gate electrode G5 connected to the light-emission control line 133, a first electrode E51 connected to the power supply voltage line 161, and a second electrode E52 connected to the first electrode E11 of the first thin-film transistor T1 and the second electrode E22 of the second thin-film transistor T2.

The sixth thin-film transistor T6 includes a gate electrode G6 connected to the light-emission control line 133, a first electrode E61 connected to the second electrode E12 of the first thin-film transistor T1 and the first electrode E31 of the third thin-film transistor T3, and a second electrode E62 connected to the pixel electrode of the organic light-emitting diode OLED. The fifth thin-film transistor T5 and the sixth thin-film transistor T6 are simultaneously turned on according to the light-emission control signal EM received via the light-emission control line 133 to permit current to be able to flow in the organic light-emitting diode OLED.

The seventh thin-film transistor T7 includes a gate electrode G7 connected to the first scan line 131, a first electrode E71 connected to the second electrode E62 of the sixth thin-film transistor T6 and the pixel electrode of the organic light-emitting diode OLED, and a second electrode E72 connected to the initializing voltage line 141. The seventh thin-film transistor T7 is turned on according to the first scan signal GWP received via the first scan line 131 and initializes a voltage of the pixel electrode of the organic light-emitting diode OLED.

The capacitor Cst includes the first electrode 41 connected to the gate electrode G1 of the first thin-film transistor T1, and a second electrode 43 connected to the power supply voltage line 161. The first electrode 41 of the capacitor Cst is also connected to the second electrode E32 of the third thin-film transistor T3 and the second electrode E42 of the fourth thin-film transistor T4.

The organic light-emitting diode OLED may include the pixel electrode and a common electrode opposite to the pixel electrode. The common electrode may receive a second power supply voltage ELVSS. The organic light-emitting diode OLED may display an image by receiving the current from the first thin-film transistor T1 and emitting light.

At least some of the first through seventh thin-film transistors T1 through T7 may include different types of semiconductor layers. For example, the first thin-film transistor T1 functioning as a driving transistor may include a semiconductor layer including polycrystalline silicon, and at least some of the second through seventh thin-film transistors T2 through T7 functioning as switching transistors may include oxide semiconductor layers.

Polycrystalline silicon is excellent in terms of electron mobility and reliability. Since the first thin-film transistor T1 which directly affects the brightness of the organic light-emitting diode OLED includes the semiconductor layer including polycrystalline silicon, the display apparatus 100 may have a high resolution.

A thin-film transistor including an oxide semiconductor layer has a low off-current and is able to operate at a low frequency. Accordingly, in an exemplary embodiment, at least one of the second through seventh thin-film transistors T2 through T7 includes an oxide conductor layer. Therefore, power consumption of the display apparatus 100 may be reduced.

FIG. 3 is a cross-sectional view illustrating a portion of the display apparatus 100. For convenience of explanation, FIG. 3 illustrates only the first thin-film transistor T1, the second thin-film transistor T2, the capacitor Cst, and the organic light-emitting diode OLED from among the above-described components of the pixel PX.

Referring to FIG. 3, a buffer layer 11 may, be disposed on the substrate 110. For example, as shown in the exemplary embodiment of FIG. 3, the buffer layer 11 may be disposed directly on the substrate 110 in a Z direction that is in the direction of the thickness of the substrate 11 and is perpendicular to the X and Y directions which are parallel to a top surface of the substrate.

The substrate 110 may include one or more of various materials, such as glass, metal, and, polymer resin. When the substrate 110 includes, metal, the substrate 110 may include iron (Fe), chromium (Cr), manganese (Mn), nickel (Ni), titanium (Ti), molybdenum (Mo), stainless steel (SUS), an Invar alloy, an Inconel alloy, and a Kovar alloy. The substrate 110 may include a polymer resin, such as polyethersulphone, polyacrylate, polyetherimide, polyethylene naphthalate, polyethylene terephthalate, polyphenylene sulfide, polyarylate, polyimide, polycarbonate, or cellulose acetate propionate.

The buffer layer 11 may planarize an upper surface of the substrate 110 and block foreign matters or the like from entering via the substrate 110. For example, the buffer layer 11 may include an inorganic material, such as silicon oxide, silicon nitride, silicon oxynitride, aluminum oxide, aluminum nitride, titanium oxide, titanium nitride, etc., or an organic material, such as polyimide, polyester, acryl, etc., and may be formed as a single layer or multiple layers.

The first thin-film transistor T1 is disposed on the buffer layer 11. For example, as shown in the exemplary embodiment of FIG. 3, the first thin-film transistor T1 may be disposed directly on the buffer layer 11 (e.g., in the Z direction). The first thin-film transistor T1 includes a first semiconductor layer A1, the first gate electrode G1, a first source electrode S1, and a first drain electrode D1. Since the first thin-film transistor T1 serves as a driving transistor, the first semiconductor layer A1 may include polycrystalline silicon.

The gate electrode G1 is disposed on the first semiconductor layer A1, and the first source electrode S1 and the first drain electrode D1 are electrically connected to each other in response to a signal applied to the first gate electrode G1.

For example, the first gate electrode G1 may include at least one material from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). However, exemplary embodiments of the present inventive concepts are not limited thereto.

A first insulating layer 12 including an inorganic material, such as silicon oxide, silicon nitride, or silicon oxynitride, may be disposed between the first semiconductor layer A1 and the first gate electrode G1. For example, as shown in FIG. 3, the first insulating layer 12 may be disposed directly on the first semiconductor layer A1 (e.g., in the Z direction) and the first gate electrode G1 is disposed directly on the first insulating layer 12 (e.g., in the Z direction). The first insulating layer 12 provides insulation between the first semiconductor layer A1 and the first gate electrode G1.

The capacitor Cst may be disposed on the first gate electrode G1 and overlap the first gate electrode G1 (e.g., in the Z direction). The capacitor Cst may include the first electrode 41 and the second electrode 43. A second insulating layer 13 including an inorganic material, such as silicon oxide, silicon nitride, or silicon oxynitride, may be disposed between the first electrode 41 and the second electrode 43. The first gate electrode G1 may also function as the first electrode 41 of the capacitor Cst. For example, the first gate electrode G1 and the first electrode 41 may be formed as a single body. As shown in FIG. 3, the second insulating layer 13 may be disposed directly on the first electrode 41 of the capacitor (e.g., in the Z direction) and the second electrode 43 of the capacitor may be disposed directly on the second insulating layer (e.g., in the Z direction).

The second electrode 43 of the capacitor Cst may be arranged on the second insulating layer 13 such that the second electrode 43 at least partially overlaps (e.g., in the Z direction) the first electrode 41 of the capacitor Cst. The second electrode 43 may be electrically connected to the power supply voltage line 161 of FIG. 2 that transmits the driving voltage.

A third insulating layer 14 including an inorganic material such as silicon oxide, silicon nitride, or silicon oxynitride, may be disposed on the second electrode 43. For example, as shown in the exemplary embodiment of FIG. 3, the third insulating layer 14 may be disposed directly on the second electrode (e.g., in the Z direction). The second thin-film transistor T2 may be disposed on the third insulating layer 14. For example, the second thin-film transistor T2 may be disposed directly on the third insulating layer 14 (e.g., in the Z direction). The distance (e.g., length in the Z direction) of a bottom surface of the second thin-film transistor 12 to a top surface of the substrate 110 is different than the distance (e.g., length in the Z direction) of a bottom surface of the first thin-film transistor T1 to a top surface of the substrate. For example, as shown in the exemplary embodiment of FIG. 3, the distance of a bottom surface of the second thin-film transistor T2 to a top surface of the substrate is greater than the distance of a bottom surface of the first thin-film transistor T1 to a top surface of the substrate.

The second thin-film transistor 12 includes a second semiconductor layer A2, the second gate electrode G2, a second source electrode S2, and a second drain electrode D2. Since the second thin-film transistor 12 serves as a switching transistor, the second semiconductor layer A2 may include an oxide semiconductor. In an exemplary embodiment, the oxide semiconductor may include an oxide of metal such as zinc (Zn), indium (In), gallium (Ga), tin (Sn), titanium (Ti) or the like. In some exemplary embodiments, the oxide semiconductor may include a mixture of the oxide of the metal and the metal, such as zinc (Zn), indium (In), gallium (Ga), tin (Sn), titanium (Ti), or the like. However, exemplary embodiments of the present inventive concepts are not limited thereto. For example, in, some exemplary embodiments the oxide semiconductor may be a Zn oxide-based material, and may include Zn oxide, In—Zn oxide, Ga—In—Zn oxide, or the like. According to some exemplary embodiments, the oxide semiconductor may be an In—Ga—Zn—O (IGZO) semiconductor containing metals, such as and Ga, in Zn Oxide.

In an exemplary embodiment, at least one of the third through seventh thin-film transistors T3 through T7 of the pixel circuit may include an oxide semiconductor layer, like the second thin-film transistor T2. According to an exemplary embodiment of the present inventive concepts, a driving transistor includes a semiconductor layer having a polycrystalline silicon semiconductor having excellent reliability, and at least one thin-film transistor (e.g., a switching transistor) includes a semiconductor layer having an oxide semiconductor having a lower leakage current. Therefore, the display apparatus 100 may provide high reliability and low power consumption.

The second gate electrode G2 may be disposed on the second semiconductor layer A2. A fourth insulating layer 15 may be disposed between the second electrode G2 and the second semiconductor layer A2. For example, the fourth insulating layer 15 may be disposed directly on the second semiconductor layer A2 (e.g., in the Z direction) and the second gate electrode G2 may be disposed directly on the fourth insulating layer (e.g., in the Z direction). As shown in the exemplary embodiment of FIG. 3, the fourth insulating layer 15 may only extend between the second semiconductor layer A2 and the second gate electrode G2. For example, as shown in FIG. 3, the lateral edges of the fourth insulating layer 15 terminate in the X direction prior to the termination of the corresponding lateral edges of the second semiconductor layer A2 and the bottom surface of the fourth insulating layer only directly contacts a top surface of the second semiconductor layer. However, in other exemplary embodiments, the fourth insulating layer 15 may be formed to correspond to the entire area of the substrate 110. The second gate electrode G2 may be at a different height (e.g., length in the Z direction to a top surface of the substrate 110) from the first gate electrode G1, and the second through fourth insulating layers 13 through 15 may be disposed between the second gate electrode G2 and the first gate electrode G1. For example, the distance (e.g., length in the Z direction) of a bottom surface of the second gate electrode G2 to a top surface of the substrate 110 is greater than the distance (e.g., length in the Z direction) of a bottom surface of the first gate electrode G1 to a top surface of the substrate.

In an exemplary embodiment, the second gate electrode G2 may include at least one material from among aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu) and may have a single-layered or multi-layered structure. The fourth insulating layer 15 may include an inorganic material, such as silicon oxide, silicon nitride, or silicon oxynitride. However, exemplary embodiments of the present inventive concepts are not limited thereto.

A light barrier layer BML may be further arranged to overlap (e.g., in the Z direction) the second semiconductor layer A2. For example, the light barrier layer BML may be disposed between the second insulating layer 13 and the third insulating layer 14. As shown in the exemplary embodiment of FIG. 3, a bottom portion of the light barrier layer BML directly contacts a top portion of the second insulating layer 13 (e.g., in the Z direction) and a top portion of the light barrier layer directly contacts a portion of the third insulating layer 14. The light barrier layer BML may prevent light from being incident upon the second thin-film transistor T2. The incidence of light induces a photocurrent in the second semiconductor layer A2 of the second thin-film transistor T2 resulting in degradation of the characteristics of the second thin-film transistor. Therefore, the inclusion of the light barrier layer BML may prevent degradation of characteristics of the second thin-film transistor T2. The light barrier layer BML may have conductivity and may be electrically connected to the second source electrode S2 of the second thin-film transistor T2, thereby improving the characteristics of the second thin-film transistor T2.

A fifth insulating layer 16 may be disposed on the second gate electrode G2 and may include an inorganic material, such as silicon oxide, silicon nitride, or silicon oxynitride to have a single-layered or multi-layered structure. For example, as shown in the exemplary embodiment of FIG. 3, the fifth insulating layer 16 may be disposed directly on the second gate electrode G2 and may cover the top surface and lateral edges of the second gate electrode.

The first source electrode S1, the first drain electrode D1, the second source electrode S2, and the second drain electrode D2 are disposed on the fifth insulating layer 16. For example, as shown in the exemplary embodiment of FIG. 3, the first source electrode S1, the first drain electrode D1, the second source electrode S2, and the second drain electrode D2 may be disposed directly on the fifth insulating layer 16 (e.g., in the Z direction).

The first source electrode S1 and the first drain electrode D1 may be electrically connected to the first semiconductor layer A1 via contact holes. For example, in the embodiment in which the fourth insulating layer 15 only extends between the second semiconductor layer A2 and the second gate electrode G2, contact holes formed in the first, second, third and fifth insulating layers 12, 13, 14 and 16 may electrically connect the first source electrode S1 and the first drain electrode D1 to the first semiconductor layer A1. The second source electrode S2 and the second drain electrode D2 may be electrically connected to the second semiconductor layer A2 via contact holes formed in the fourth insulating layer 15 and the fifth insulating layer 16.

In an exemplary embodiment, the first source electrode S1, the first drain electrode D1, the second source electrode S2, and the second drain electrode D2 may include at least one material from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) and may have a single-layered or multi-layered structure, in consideration of conductivity or the like.

A sixth insulating layer 17 may be on the first thin-film transistor T1 and the second thin-film transistor T2, respectively, having the above-described structures. For example, as shown in FIG. 3, when the organic light-emitting diode OLED is arranged at a higher location (e.g., in the Z direction) than the first transistor T1 and the second thin-film transistor T2, the sixth insulating layer 17 may cover the first thin-film transistor T1 and the second thin-film transistor T2 to planarize unevenness caused by the first thin-film transistor T1 and the second thin-film transistor T2. In air exemplary embodiment, the sixth insulating layer 17 may include an organic material, such as, acryl, benzocyclobutene (BCB) or hexamethyldisiloxane (HMDSO). However, exemplary embodiments of the present inventive concepts are not limited thereto.

A conductive layer 140 may be arranged on the sixth insulating layer 17. For example, as shown in the exemplary embodiment of FIG. 3, the conductive layer 140 may be disposed directly on the sixth insulating layer 17. The conductive layer 140 may be a connecting electrode that electrically connects one electrode of one of the plurality of transistors and the capacitor Cst of the pixel PX, including the first thin-film transistor T1 and the second thin-film transistor T2, to a pixel electrode 210.

A seventh insulating layer 18 including an organic material, such as, acryl, BCB, or HMDSO, may be disposed on the conductive layer 140, and an organic light-emission diode OLED may be disposed on the seventh insulating layer 18. For example, as shown in the exemplary embodiment of FIG. 3, the seventh insulating layer 18 is disposed directly on the conductive layer 140 (e.g., in the Z direction) and the organic light-emission diode OLED is disposed directly on the seventh insulating layer 18.

The organic light-emission diode OLED includes the pixel electrode 210, an opposite electrode 230, and an intermediate layer 220 disposed between the pixel electrode 210 and the opposite electrode 230 and including an emission layer.

The pixel electrode 210 may be electrically connected to the conductive layer 140 through a contact hole formed in the seventh insulating layer 18. In an exemplary embodiment, the pixel electrode 210 may be a transparent (or semi-transparent) electrode or a reflective electrode. In embodiments in which the pixel electrode 210 is a transparent (or semi-transparent) electrode, the pixel electrode 210 may include, for example, indium tin oxide (ITO), indium zinc oxide (IVO), zinc oxide (ZnO), indium oxide (In2O3), indium gallium oxide (IGO), or aluminum zinc oxide (AZO). In embodiments in which the pixel electrode 210 is a reflective electrode, the pixel electrode 210 may include a reflective layer in eluding silver (Ag), magnesium (Mg), aluminum (Al), platinum (Pt), palladium (Pd), gold (Au), nickel (Ni), neodymium (Nd), iridium (Ir), chromium (Cr), or a compound thereof, and a layer including ITO, IZO, ZnO, In2O3, IGO, or AZO. However, exemplary embodiments of the present inventive concepts are not limited thereto and the pixel electrode 210 may include any of various other materials and may have any of various structures, such as, a single-layered or multi-layered structure.

An eighth insulating layer 19 may be disposed on the seventh insulating layer 18. For example, as shown in the exemplary embodiment of FIG. 3, the eight insulating layer 19 may be disposed directly on the seventh insulating layer 18 (e.g., in the Z direction). The eighth insulating layer 19 defines an emission area by including an opening via which at least a center portion of the pixel electrode 210 is exposed. In this embodiment as illustrated in FIG. 3, the eighth insulating layer 19 covers an edge of the pixel electrode 210 and accordingly increases a distance between the edge of the pixel electrode 210 and the opposite electrode 230 disposed over the pixel electrode 210 to thereby prevent' an arc or the like from occurring on the edge of the pixel electrode 210. In an exemplary embodiment, the eighth insulating layer 19 may include an organic material, such as polyimide or HMDSO. However, exemplary embodiments of the present inventive concepts are not limited thereto.

The intermediate layer 220 of the organic light-emission diode OLED includes the emission layer. The emission layer may include a low molecular or high molecular organic material that emits light of a certain color. The intermediate layer 220 may further include at least one functional layer from among a hole transport layer (HTL) a hole injection layer (HIL), an electron transport layer (ETL), and an electron injection layer (EIL). The functional layer may include an organic material.

The opposite electrode 230 may be formed as a single body constituting a plurality of organic light-emission diodes OLEDs, and thus may correspond to the plurality of pixel electrodes 210. For example, the opposite electrode 230 may extend in the X direction and serve as the opposite electrode for a plurality of organic light-emission diodes OLEDs. In an exemplary embodiment, the opposite electrode 230 may be a transparent (or semi-transparent) electrode or a reflective electrode. In an embodiment in which the opposite electrode 230 is a transparent (or semi-transparent) electrode, the opposite electrode 230 may have a layer including a metal having a small work function, such as Li, Ca, LiF/Ca, LiF/Al, Al, Ag, Mg, or a compound thereof, and a transparent (or semi-transparent) conductive layer including, ITO, IZO, ZnO, In2O3 or the like. However, exemplary embodiments are not limited thereto. In embodiments in which the opposite electrode 230 is a reflective electrode, the opposite electrode 230 may have a layer including Li, Ca, LiF/Ca, LiF/Al, Al, Ag, Mg, or a compound thereof. The configuration of the opposite electrode 230 and the material included in the opposite electrode 230 are not limited to those described above, and various modifications may be made to the opposite electrode 230.

An encapsulation layer for protecting the organic light-emitting diode OLED from external moisture, oxygen, or the like may be located on the opposite electrode 230. The encapsulation layer may cover the display area DA and extend beyond the display area DA. The encapsulation layer may include an inorganic encapsulation layer including at least one inorganic material, and an organic encapsulation layer including at least one organic material. According to some exemplary embodiments, the encapsulation layer may have a stacked structure in which a first inorganic encapsulation layer, an organic encapsulation layer and a second inorganic encapsulation layer are stacked on each other. Various functional layers, such as a polarization layer for reducing external light reflection, a black matrix, a color filter, and/or a touch screen layer including a touch electrode, may be arranged on the encapsulation layer.

As described above, the first semiconductor layer A1 of the first thin-film transistor T1 being a driving transistor may include polycrystalline silicon. Accordingly, a defect (trap) within the first semiconductor layer A1 may be reduced via thermal treatment, and thus a threshold voltage Vth of the first thin-film transistor T1 may be reduced and a voltage margin of the threshold voltage Vth may be increased. Consequently, reliability of the first thin-film transistor T1 may improve. However, when thermal treatment is performed to increase the reliability of the first thin-film transistor T1, the characteristics of the second thin-film transistor T2 including the oxide semiconductor layer may be changed. Therefore, it is difficult to improve the reliability of the first thin-film transistor T1 via thermal treatment. On the other hand, when the reliability of the first thin-film transistor T1 is not improved, a driving margin of the first thin-film transistor T1 is too narrow, and an afterimage or the like may be generated on the display apparatus 100.

Accordingly, to improve the reliability of the first thin-film transistor T1 without affecting the second thin-film transistor T2, the first semiconductor layer A1 may be doped with impurities. When a channel region of the first semiconductor layer A1 is doped with impurities, a hysteresis characteristic of the first semiconductor layer A1 may be improved, and the voltage margin of the threshold voltage may be increased. However, when the doping concentration of the impurities in the channel region of the first semiconductor layer A1 is increased, the threshold voltage of the first thin-film transistor T1 is shifted in a positive (+) direction. For example, when the channel region of the first semiconductor layer A1 is doped with boron (B) by a doping amount of $3 \times e^{11}/cm^2$, the threshold voltage of the first thin-film transistor T1 is shifted about 0.6V in the positive (+) direction. Therefore, it would be advantageous to modify a threshold voltage value generated when the first semiconductor layer A1 is doped with impurities to be approximately equal to the threshold voltage value prior to the doping. This will be described later in more detail with reference to FIGS. 4 through 8.

Figure 4:
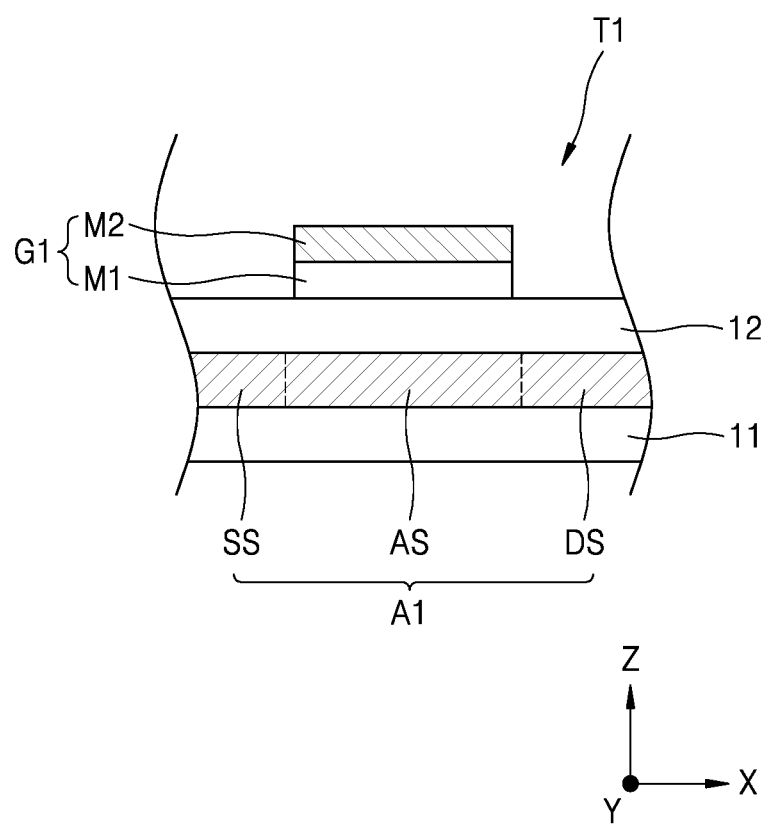
FIG. 4 is a cross-sectional view of an exemplary embodiment of a first thin-film transistor of FIG. 3.
Figure 5:
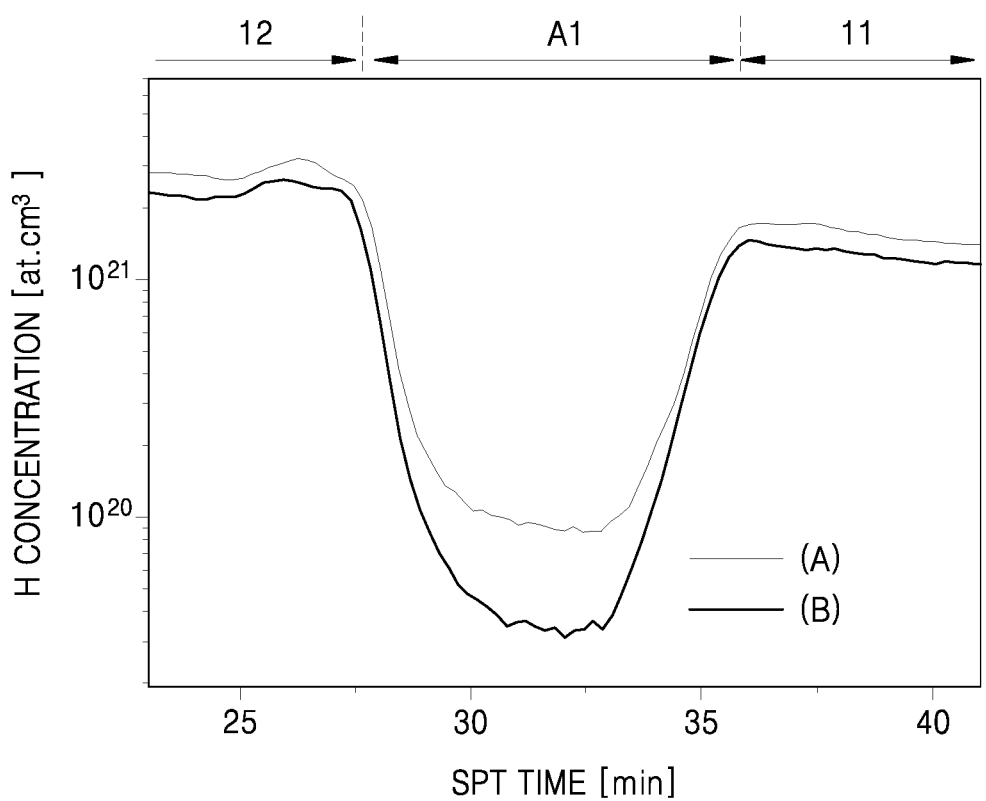
FIG. 5 is a graph showing hydrogen concentrations within a buffer layer, a first semiconductor layer, and a first insulating layer of FIG. 4 according to an exemplary embodiment of the present inventive concepts.
Figure 6:
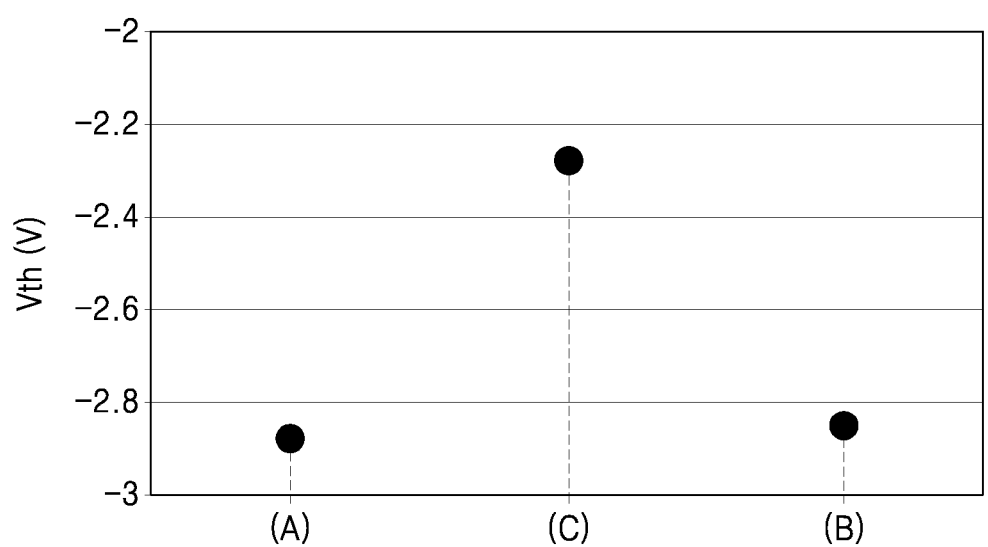
FIG. 6 is a graph showing the magnitude of a threshold voltage of the first thin-film transistor of FIG. 3 according to an exemplary embodiment of the present inventive concepts.

FIG. 4 is a cross-sectional view of an exemplary embodiment of the first thin-film transistor T1 of FIG. 3. FIG. 5 is a graph showing hydrogen concentrations within the buffer layer 11, the first semiconductor layer A1, and the first insulating layer 12 of FIG. 4 in accordance with an exemplary embodiment. FIG. 6 is a graph showing the magnitudes of threshold voltages of the first thin-film transistor T1 of FIG. 3 in accordance with an exemplary embodiment.

For convenience of explanation, FIG. 4 shows only the first semiconductor layer A1 and the first gate electrode G1 of the first thin-film transistor T1.

As shown in FIG. 4, the first semiconductor layer A1 includes a channel region AS overlapping the first gate electrode G1 (e.g., in the Z direction) and a source region SS and a drain region DS respectively arranged on both sides of the channel region AS (e.g., in the X direction). By doping the channel region AS with impurities, the characteristics of the first thin-film transistor T1 may be improved even when thermal treatment is not performed.

For example, the first thin-film transistor T1 may be a P-channel thin-film transistor, and the source region SS, the drain region DS, and the channel region AS may be doped with P-type impurities. The impurities may be, for example, boron (B). However, in other exemplary embodiments, the impurities may be one or more other compounds.

In an exemplary embodiment, the first semiconductor layer A1 may be formed by forming an amorphous silicon layer on the buffer layer 11, applying excimer laser to the amorphous silicon layer, and crystallizing the amorphous silicon layer. In one exemplary embodiment, impurities are injected into the amorphous silicon layer prior to the crystallization and the amorphous silicon layer may then be crystallized. Alternatively, the amorphous silicon layer may be first crystallized and the first semiconductor layer A1 may be formed and the impurities may be subsequently injected into the first semiconductor layer A1.

The first gate electrode G1 may then be formed on the first insulating layer 12, and impurities may be secondarily injected into the source region SS and the drain region DS by using the first gate electrode G1 as a mask. Accordingly, impurity-doping concentrations of the source region SS and the drain region DS may be each greater than an impurity-doping concentration of the channel region AS.

For example, in an exemplary embodiment, the doping concentration of the channel region AS may be $1 \times e^{11}/cm^2$ to $1 \times e^{13}/cm^2$. When the doping concentration of the channel region AS is greater than $1 \times e^{13}/cm^2$, a value by which the threshold voltage of the first thin-film transistor T1 is shifted in the positive (+) direction is too large, and thus, as will be described later, even when diffusion of hydrogen into the channel region AS is prevented, it may be difficult to return the shifted threshold voltage to the original value. On the other hand, when the doping concentration of the channel region AS is less than $1 \times e^{11}/cm^2$, it is difficult to improve the characteristics of the first thin-film transistor T1.

Each of the doping concentrations of the source region SS and the drain region DS may be greater than the doping concentration of the channel region AS. For example, in an exemplary embodiment, each of the doping concentrations of the source region SS and the drain region DS may be about $1 \times e^{15}/cm^2$.

During the manufacture of the first thin-film transistor T1 and the like, hydrogen included in an inorganic layer such as the first insulating layer 12 may be diffused into the channel region AS. The hydrogen diffused into the channel region AS may affect the doping concentration of the channel region AS. In other words, when hydrogen is diffused into the channel region AS doped with boron (B), the value by which the threshold voltage of the first thin-film transistor T1 is shifted in the positive (+) direction may increase and it may be difficult to return a shifted threshold voltage to the original value. Therefore, the diffusion of hydrogen into the channel region AS should be prevented.

As shown in the exemplary embodiment of FIG. 4, the first gate electrode G1 may have a stack structure of a first layer M1 including molybdenum (Mo) and a second layer M2 including titanium (Ti). For example, the first gate electrode G1 may include the second layer M2 including titanium (Ti) disposed directly on the first layer M1 (e.g., in the Z direction) which includes molybdenum (Mo). As shown in the exemplary embodiment of FIG. 4, the second layer M2 may be disposed directly on top of the first layer M1. A top surface of the first layer M1 may directly contact a bottom surface of the second layer M2. The titanium (Ti) of the second layer M2 may collect the hydrogen, and thus the diffusion of hydrogen into the channel region AS may be prevented. While the first layer M1 in the exemplary embodiment includes Molybdenum (Mo), the first layer may include another material different from the material of the second layer M2.

FIG. 5 illustrates a result of measuring a hydrogen concentration according to a depth from the first insulating layer 12 to the buffer layer 11. The hydrogen concentration in the first semiconductor layer A1 of FIG. 5 means a hydrogen concentration in the channel region AS of the first semiconductor layer A1. (A) of FIG. 5 indicates a hydrogen concentration when the first gate electrode G1 includes only the first layer M1 including molybdenum (Mo), and (B) of FIG. 5 indicates a hydrogen concentration when the first gate electrode G1 includes the stack structure having the first layer M1 including molybdenum (Mo) and the second layer M2 including titanium (Ti). As seen from FIG. 5, the hydrogen concentration in the first semiconductor layer A1 is greatly reduced in the case of (B), compared to the case of (A). The second gate electrode G2 of FIG. 3 of the second thin-film transistor T2 of FIG. 3 does not have a structure capable of collecting hydrogen, in contrast with the first gate electrode G1. Accordingly, the hydrogen concentration within the second semiconductor layer A2 of FIG. 3 may be greater than the hydrogen concentration within the first semiconductor layer A1.

FIG. 6 illustrates the threshold voltage Vth of the first thin-film transistor T1. (A) of FIG. 6 may indicate a reference threshold voltage of the first thin-film transistor T1 when the first gate electrode G1 includes only the first layer M1 including molybdenum (Mo), similar to (A) of FIG. 5. In this embodiment, the channel region AS is not doped with boron, and hydrogen has been, diffused into the channel region AS during the manufacture of the first thin-film transistor T1.

(B) of FIG. 6 indicates a threshold voltage of the first thin-film transistor T1 when the channel region AS is doped with boron and the first gate electrode G1 further includes the second layer M2 in addition to the first layer M1, and (C) of FIG. 6 indicates a threshold voltage of the first thin-film transistor T1 when the channel region AS is doped with boron and the first gate electrode G1 includes only the first layer M1.

In comparing (A) and (C) of FIG. 6 with each other, the threshold voltage of the first thin-film transistor T1 was changed in the positive (+) direction due to the doping of boron. However, in the case of (B), even when boron is doped similar to the case of (C), the threshold voltage of the first thin-film transistor T1 is very similar to that in the case of (A). This is because the prevention of diffusion of hydrogen into the channel region AS during the manufacture of the first thin-film transistor T1 may prevent the threshold voltage of the first thin-film transistor T1 from being further changed in the positive (+) direction due to diffusion of hydrogen.

Therefore, according to an exemplary embodiment of the present inventive concepts, doping of boron in the channel region AS may improve the characteristics of the first thin-film transistor T1 without affecting the second thin-film transistor T2 of FIG. 3, and the inclusion of the second layer M2 including titanium in the first gate electrode G1 may prevent the threshold voltage of the first thin-film transistor T1 from being changed due to boron doping. In this exemplary embodiment when boron is doped in the channel region AS and diffusion of hydrogen is blocked, the doping concentration of boron in the channel region AS may be $1 \times e^{11}/cm^2$ to $1 \times e^{13}/cm^2$ in which the threshold voltage of the first thin-film transistor T1 may have approximately the same value as the reference threshold voltage (A of FIG. 6).

Figure 7:
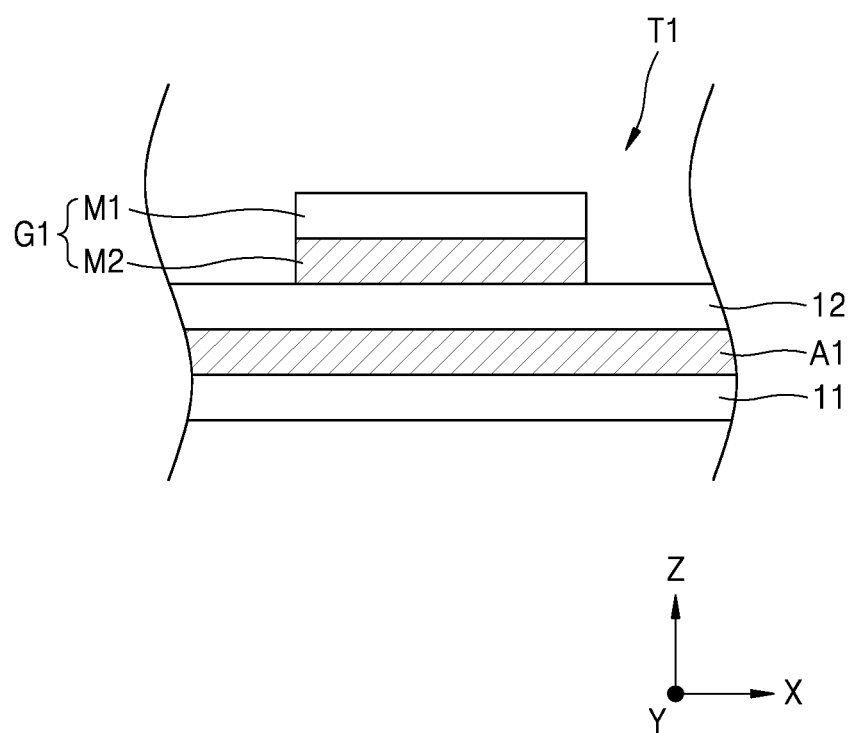
FIG. 7 is a cross-sectional view of another exemplary embodiment of the first thin-film transistor of FIG. 3.
Figure 8:
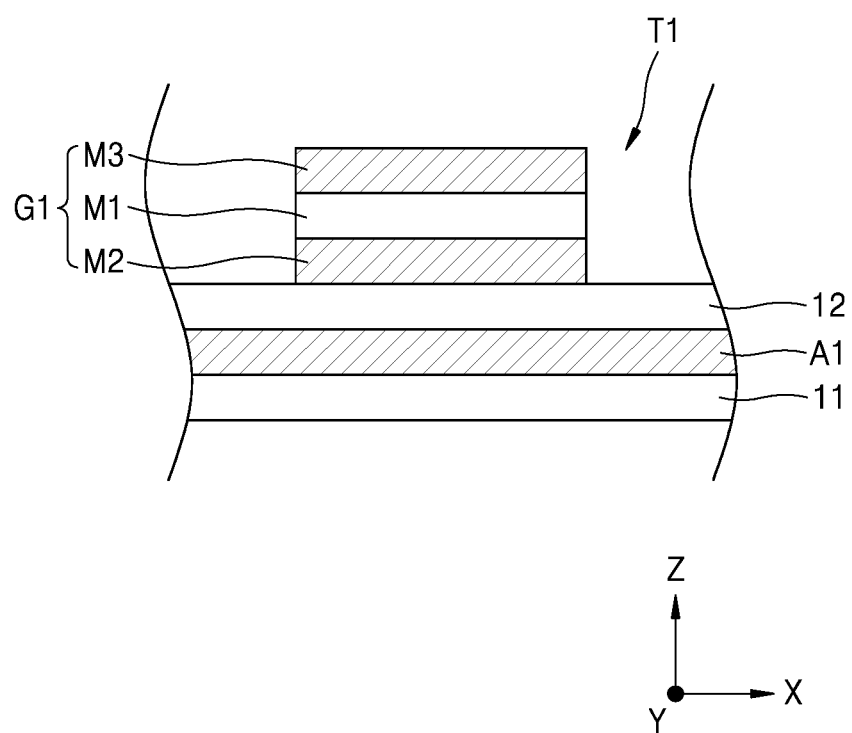
FIG. 8 is a cross-sectional view of another exemplary embodiment of the first thin-film transistor of FIG. 3.

FIGS. 7 and 8 are cross-sectional views of another exemplary embodiment of the first thin-film transistor T1.

The first thin-film transistor T1 of FIG. 7 includes the first gate electrode G1 including both the first layer M1 and the second layer M2 which includes titanium (Ti), and thus prevents or minimizes diffusion of hydrogen from the buffer layer 11, the first insulating layer 12, and the like into the first semiconductor layer A1, as described above. However, in the exemplary embodiment of FIG. 7, the first gate electrode G1 includes the second layer M2 including titanium disposed below the first layer M1. For example, the top surface of the second layer M2 directly contacts the bottom surface of the first layer M1. The second layer M2 may be located between the first layer M1 and the first semiconductor layer A1 to effectively prevent hydrogen from being diffused into the first semiconductor layer A1. The first layer may include another material different from the material of the second layer M2. For example the first layer may not include titanium.

As shown in the exemplary embodiment of FIG. 8, the first gate electrode G1 may have a three-layered structure in which the second layer M2 and a third layer M3 are located below and above the first layer M1, respectively. For example, a bottom surface of the first layer M1 may directly contact a top surface of the second layer M2 and a top surface of the first layer may directly contact a bottom surface of the third layer M3. In this embodiment, each of the second layer M2 and the third layer M3 may include titanium. Accordingly, the first gate electrode G1 may have an improved hydrogen collecting capability, and diffusion of hydrogen into the first semiconductor layer A1 may be effectively prevented.

According to exemplary embodiments of the present inventive concepts, display apparatuses employing different types of thin-film transistors may prevent degradation of the quality of an image by including thin-film transistors having improved characteristics.

While the disclosure has been particularly shown and described with reference to exemplary embodiments thereof, it will be understood by those of ordinary skill in the art that various changes in form and details may be made therein without departing from the spirit and scope as defined by the following claims.

What is claimed is:

1. A display apparatus comprising:
 a substrate;
 a first thin-film transistor and a second thin-film transistor disposed on the substrate, the first transistor and the second thin-film transistor arranged at different distances from a top surface of the substrate;
 a capacitor overlapping the first thin-film transistor in a direction of a thickness of the substrate, wherein the capacitor comprises a first electrode and a second electrode that overlaps the first electrode in the direction of the thickness of the substrate; and
 a display device electrically connected to the first thin-film transistor,
 wherein the first thin-film transistor comprises a first semiconductor layer including polycrystalline silicon and a first gate electrode that overlaps a channel region of the first semiconductor layer in a direction of a thickness of the substrate,
 the second thin-film transistor comprises a second semiconductor layer including an oxide semiconductor,
 the first gate electrode has a stacked structure including a first layer and a second layer, wherein the second layer includes titanium and the first layer includes a different material from the second layer, and
 a first insulating layer is disposed between the first semiconductor layer and the first gate electrode, a second insulating layer is disposed between the first gate electrode and the second electrode, and a third insulating layer is disposed on the second electrode, wherein the second electrode is under the third insulating layer and the second semiconductor layer is over the third insulating layer.

2. The display apparatus of claim 1, wherein the second layer is disposed between the first layer and the first semiconductor layer.

3. The display apparatus of claim 2, wherein the first gate electrode further comprises a third layer that is disposed on the first layer and includes titanium.

4. The display apparatus of claim 1,
 wherein the first gate electrode is a first electrode of the capacitor.

5. The display apparatus of claim 1, further comprising:
 a light barrier layer that overlaps the second semiconductor layer in the direction of the thickness of the substrate and is disposed between the second insulating layer and the third insulating layer.

6. The display apparatus of claim 1, wherein:
 the channel region of the first semiconductor layer overlaps the first gate electrode in the direction of the thickness of the substrate,
 the first semiconductor layer includes a drain region and a source region respectively arranged on both sides of the channel region,
 the channel region, the source region, and the drain region are doped with identical impurities, and
 a doping concentration of the impurities of the channel region is less than doping concentrations of the impurities of the drain region and the source region.

7. The display apparatus of claim 6, wherein the doping concentration of the impurities of the channel region are in a range of $1 \times e^{11}/cm^2$ to $1 \times e^{13}/cm^2$.

8. The display apparatus of claim 6, wherein the impurities are boron (B).

9. The display apparatus of claim 1, wherein a hydrogen concentration of the second semiconductor layer is greater than a hydrogen concentration of the first semiconductor layer.

10. A display apparatus comprising:
a substrate;
a first thin-film transistor and a second thin-film transistor disposed on the substrate;
a capacitor overlapping the first thin-film transistor in a direction of a thickness of the substrate, wherein the capacitor comprises a first electrode and a second electrode that overlaps the first electrode in the direction of the thickness of the substrate; and
a display device electrically connected to the first thin-film transistor,
wherein the first thin-film transistor comprises a first semiconductor layer including polycrystalline silicon and doped with impurities and a first gate electrode that overlaps the first semiconductor layer in a direction of a thickness of the substrate,
the first semiconductor layer includes a channel region that overlaps the first gate electrode in the direction of the thickness of the substrate, and a drain region and a source region respectively arranged on both sides of the channel region,
a doping concentration of the impurities of the channel region is less than doping concentrations of the impurities of the drain region and the source region, and
the first gate electrode includes a first layer and a second layer, wherein the second layer includes titanium and the first layer includes a different material from the second layer,
a first insulating layer is disposed between the first semiconductor layer and the first gate electrode, a second insulating layer is disposed between the first gate electrode and the second electrode, and a third insulating layer is disposed on the second electrode, wherein the second electrode is under the third insulating layer and the second semiconductor layer is over the third insulating layer.

11. The display apparatus of claim 10, wherein the doping concentration of the impurities of the channel region is in a range of $1 \times e^{11}/cm^2$ to $1 \times e^{13}/cm^2$.

12. The display apparatus of claim 10, wherein the impurities are boron (B).

13. The display apparatus of claim 10, wherein the second layer is disposed between the first layer and the first semiconductor layer.

14. The display apparatus of claim 13, wherein the first gate electrode further comprises a third layer that is disposed on the first layer and includes titanium.

15. The display apparatus of claim 10,
wherein the first gate electrode is a first electrode of the capacitor.

16. The display apparatus of claim 10, wherein the second thin-film transistor comprises a second semiconductor layer including an oxide semiconductor.

17. The display apparatus of claim 16, wherein a hydrogen concentration of the second semiconductor layer is greater than a hydrogen concentration of the first semiconductor layer.

18. The display apparatus of claim 16, further comprising:
a light barrier layer that overlaps the second semiconductor layer in the direction of the thickness of the substrate and is disposed between the second insulating layer and the third insulating layer.

* * * * *